(12) United States Patent
Shirahase et al.

(10) Patent No.: US 9,888,580 B2
(45) Date of Patent: Feb. 6, 2018

(54) METHOD FOR MANUFACTURING MULTILAYER SUBSTRATE, MULTILAYER INSULATION FILM, AND MULTILAYER SUBSTRATE

(71) Applicant: SEKISUI CHEMICAL CO., LTD., Osaka (JP)

(72) Inventors: Kazutaka Shirahase, Ibaraki (JP); Kazuyoshi Shiomi, Ibaraki (JP); Tatsushi Hayashi, Ibaraki (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/425,496

(22) PCT Filed: Sep. 25, 2013

(86) PCT No.: PCT/JP2013/075876
§ 371 (c)(1),
(2) Date: Mar. 3, 2015

(87) PCT Pub. No.: WO2014/050871
PCT Pub. Date: Apr. 3, 2014

(65) Prior Publication Data
US 2015/0257277 A1    Sep. 10, 2015

(30) Foreign Application Priority Data

Sep. 27, 2012 (JP) .................................. 2012-214534
Sep. 27, 2012 (JP) .................................. 2012-214535

(51) Int. Cl.
*H05K 3/10* (2006.01)
*H05K 3/46* (2006.01)
(Continued)

(52) U.S. Cl.
CPC ............ *H05K 3/107* (2013.01); *H05K 1/0298* (2013.01); *H05K 1/036* (2013.01); *H05K 1/0373* (2013.01);
(Continued)

(58) Field of Classification Search
CPC ....... H01L 23/498; H01L 23/538; H05K 1/02; H05K 3/46; H05K 1/0298; H05K 1/036;
(Continued)

(56) References Cited

U.S. PATENT DOCUMENTS

2010/0006334 A1    1/2010 Takenaka et al.
2011/0097553 A1    4/2011 Hong et al.
(Continued)

FOREIGN PATENT DOCUMENTS

EP    1 035 581 A2 *  9/2000
JP    6260763 A *  9/1994
(Continued)

OTHER PUBLICATIONS

Japanese Office Action issued with respect to application No. 291395, dated Jun. 30, 2015.
(Continued)

*Primary Examiner* — Carl Arbes
(74) *Attorney, Agent, or Firm* — Greenblum & Bernstein, P.L.C.

(57) ABSTRACT

A manufacturing method of a multilayer substrate uses a multilayer insulation film which includes a first insulation layer and a second insulation layer laminated on one surface of the first insulation layer, the second insulation layer being configured such that, in partially removing the second insulation layer, only the second insulation layer is enabled to be selectively removed to form a groove having a depth equal to a thickness of the second insulation layer on an obtained insulation layer. The manufacturing method includes: lami-
(Continued)

nating the multilayer insulation film on a surface of a circuit board; selectively and partially removing only the second insulation layer out of the first insulation layer and the second insulation layer to form the groove having a depth equal to the thickness of the second insulation layer on the obtained insulation layer; and forming metal wiring within the groove formed on the insulation layer.

8 Claims, 2 Drawing Sheets

(51) Int. Cl.
*H05K 1/02* (2006.01)
*H05K 1/03* (2006.01)
(52) U.S. Cl.
CPC ..... *H05K 3/465* (2013.01); *H05K 2201/0195* (2013.01); *H05K 2201/09036* (2013.01); *H05K 2203/063* (2013.01); *H05K 2203/107* (2013.01); *Y10T 156/1082* (2015.01); *Y10T 428/24983* (2015.01)
(58) Field of Classification Search
CPC ...... H05K 1/0373; H05K 3/107; H05K 3/465; H05K 2201/0196; H05K 2201/09036; H05K 2203/063; H05K 2203/107; Y10T 156/1082; Y10T 428/24983
See application file for complete search history.

(56) References Cited

U.S. PATENT DOCUMENTS

| | | |
|---|---|---|
| 2011/0232943 A1 | 9/2011 | Hida et al. |
| 2014/0116769 A1 | 5/2014 | Takenaka et al. |

FOREIGN PATENT DOCUMENTS

| | | | |
|---|---|---|---|
| JP | 2003-110246 A | | 4/2003 |
| JP | 2004-356238 A | | 12/2004 |
| JP | 2005-51053 A | | 2/2005 |
| JP | 2005-223226 A | | 8/2005 |
| JP | 2005-244069 A | | 9/2005 |
| JP | 2005244069 A | * | 9/2005 |
| JP | 2009-084507 A | | 4/2009 |
| JP | 2010-153571 A | | 7/2010 |
| JP | 2010-262954 A | | 11/2010 |
| JP | 2011-91351 A | | 5/2011 |
| JP | 2011-228632 A | | 11/2011 |
| WO | 2008/090835 A1 | | 7/2008 |
| WO | 2010/004841 A | | 1/2010 |

OTHER PUBLICATIONS

International Search Report for PCT/JP2013/075876, dated Oct. 22, 2013.

Japanese Office Action in respect to Japanese Application No. 2016-187311, dated Jul. 24, 2017.

* cited by examiner

METHOD FOR MANUFACTURING MULTILAYER SUBSTRATE, MULTILAYER INSULATION FILM, AND MULTILAYER SUBSTRATE

TECHNICAL FIELD

The present invention relates to a method for manufacturing a multilayer substrate in which an insulation layer is formed. The present invention relates to, for example, a multilayer insulation film which can be suitably used for forming an insulation layer in a multilayer substrate. In addition, the present invention also relates to a multilayer substrate using the multilayer insulation film.

BACKGROUND ART

Hitherto, various resin compositions have been used for forming insulation layers in electronic components such as laminated plates and printed wiring boards. For example, in multilayer printed wiring boards, resin compositions are used for forming insulation layers to insulate interlayers located internally, and for forming insulation layers located on surface layer portions. The insulation layers generally have circuit patterns, which are metal layers, formed on the surface thereof.

In addition, for circuit formation in manufacture of a semiconductor package, it is important how to accurately form circuit (Cu plating, etc.) patterns. As one method for forming a circuit pattern, there is a method in which a patterned groove is formed on an insulation layer and a metal is loaded into the groove to form a circuit pattern within the groove. This method is called a trenching process. A method for forming a groove by the trenching process is disclosed, for example, in Patent Literature 1 below.

CITATION LIST

Patent Literature

[PTL 1] Japanese Laid-Open Patent Publication No. 2005-51053

SUMMARY OF THE INVENTION

Problems to be Solved by the Invention

In the above-described trenching process, the depth of a groove (trench) can be controlled to some extent to form a patterned groove. However, in the case where a groove is formed by laser direct drawing or the like, it is difficult to highly accurately control the depth of the groove.

Also, a pattern formation method typified by a semi-additive process (SAP) or the like is known. In the SAP, circuit (Cu plating, etc.) patterns are convexly formed on the surface of an insulation layer. Next, another insulation layer is laminated on the insulation layer and the circuit patterns. In this case, in laminating the other insulation layer, there is the problem in that voids (gaps) are likely to occur between the circuit patterns. Furthermore, after the other insulation layer is laminated, there is the problem in that the evenness of the surface of the other insulation layer decreases. Moreover, when the circuit pattern formation and the insulation layer lamination are repeated to increase the number of laminated layers, the evenness of the surface of the insulation layer that is an upper layer is likely to further decrease.

In the case where a circuit pattern is formed by the above trenching process, the above problems, which arise when circuit patterns are formed by the SAP, do not arise. Therefore, forming circuit patterns by the trenching process has many advantages.

However, as described above, in the trenching process, it is difficult to highly accurately control the depth of a groove to be formed on an insulation layer. Therefore, it is also difficult to highly accurately control the shape of a circuit pattern to be formed within the groove.

An object of the present invention is to provide a manufacturing method of a multilayer substrate which allows a groove having a predetermined depth to be accurately formed thereon. In addition, another object of the present invention is to provide a multilayer insulation film which allows a groove having a predetermined depth to be accurately formed thereon, and a multilayer substrate using the multilayer insulation film.

Solution to the Problems

According to a broad aspect of the present invention, a manufacturing method of a multilayer substrate is provided which uses a multilayer insulation film which includes a first insulation layer and a second insulation layer laminated on one surface of the first insulation layer, the second insulation layer being configured such that, in partially removing the second insulation layer, only the second insulation layer out of the first insulation layer and the second insulation layer is enabled to be selectively removed to form a groove having a depth equal to a thickness of the second insulation layer on an obtained insulation layer, the manufacturing method including: a step of laminating the multilayer insulation film on a surface of a circuit board; a step of selectively and partially removing only the second insulation layer out of the first insulation layer and the second insulation layer to form the groove having a depth equal to the thickness of the second insulation layer on the obtained insulation layer; and a step of forming metal wiring within the groove formed on the insulation layer.

In a specific aspect of the manufacturing method of the multilayer substrate according to the present invention, the second insulation layer is scraped or melted in partially removing the second insulation layer.

In a specific aspect of the manufacturing method of the multilayer substrate according to the present invention, the first insulation layer is made harder than the second insulation layer in partially removing the second insulation layer.

In a specific aspect of the manufacturing method of the multilayer substrate according to the present invention, the multilayer insulation film is a multilayer insulation film in which only the second insulation layer out of the first insulation layer and the second insulation layer is enabled to be selectively removed when laser direct drawing is performed from the second insulation layer side, and by performing laser direct drawing on the multilayer insulation film from the second insulation layer side, only the second insulation layer out of the first insulation layer and the second insulation layer is selectively and partially removed to form the groove having a depth equal to the thickness of the second insulation layer on the obtained insulation layer.

In a specific aspect of the manufacturing method of the multilayer substrate according to the present invention, a degree of crosslinking of a resin component in the first insulation layer is made higher than a degree of crosslinking of a resin component in the second insulation layer in partially removing the second insulation layer, or a contained amount of an inorganic filler in the first insulation layer is more than a contained amount of an inorganic filler in the second insulation layer.

In a specific aspect of the manufacturing method of the multilayer substrate according to the present invention, a multilayer insulation film is used in which the second insulation layer is configured such that, in partially removing the second insulation layer, only the second insulation layer out of the first insulation layer and the second insulation layer is enabled to be melted and selectively removed to form the groove having a depth equal to the thickness of the second insulation layer on the obtained insulation layer; in the step of forming the groove having the depth equal to the thickness of the second insulation layer on the obtained insulation layer, only the second insulation layer out of the first insulation layer and the second insulation layer is selectively melted and partially removed; and only either one of the first insulation layer and the second insulation layer is enabled to be cured in a state of the multilayer insulation film, only the second insulation layer out of the first insulation layer and the second insulation layer is enabled to be partially dissolved in a developer in development after exposure, or only the second insulation layer out of the first insulation layer and the second insulation layer is enabled to be melted and removed by irradiation of laser light.

In a specific aspect of the manufacturing method of the multilayer substrate according to the present invention, the multilayer insulation film enables only either one of the first insulation layer and the second insulation layer to be cured in a state of the multilayer insulation film.

In a specific aspect of the manufacturing method of the multilayer substrate according to the present invention, only the second insulation layer out of the first insulation layer and the second insulation layer is enabled to be partially dissolved in a developer in development after exposure.

In a specific aspect of the manufacturing method of the multilayer substrate according to the present invention, only the second insulation layer out of the first insulation layer and the second insulation layer is enabled to be melted and removed by irradiation of laser light in partially removing the second insulation layer.

According to a broad aspect of the present invention, a multilayer insulation film is provided which is used for forming an insulation layer having a groove, the multilayer insulation film including: a first insulation layer; and a second insulation layer laminated on one surface of the first insulation layer. The second insulation layer is configured such that, in partially removing the second insulation layer, only the second insulation layer out of the first insulation layer and the second insulation layer is enabled to be selectively removed to form a groove having a depth equal to a thickness of the second insulation layer on an obtained insulation layer.

In a specific aspect of the multilayer insulation film according to the present invention, the second insulation layer is enabled to be scraped or melted in partially removing the second insulation layer.

In a specific aspect of the multilayer insulation film according to the present invention, the first insulation layer is harder than the second insulation layer.

In a specific aspect of the multilayer insulation film according to the present invention, a degree of crosslinking of a resin component in the first insulation layer is higher than a degree of crosslinking of a resin component in the second insulation layer, or a contained amount of an inorganic filler in the first insulation layer is more than a contained amount of an inorganic filler in the second insulation layer.

The multilayer insulation film according to the present invention is suitably used for forming an insulation layer on a circuit board in a multilayer substrate.

According to a broad aspect of the present invention, a multilayer substrate is provided which includes: a circuit board; an insulation layer disposed on the circuit board and having a groove; and metal wiring formed within the groove. The insulation layer is formed using the above-described multilayer insulation film.

Advantageous Effects of the Invention

The manufacturing method of the multilayer substrate according to the present invention uses a multilayer insulation film which includes a first insulation layer and a second insulation layer laminated on one surface of the first insulation layer, the second insulation layer being configured such that, in partially removing the second insulation layer, only the second insulation layer out of the first insulation layer and the second insulation layer is enabled to be selectively removed to form a groove having a depth equal to the thickness of the second insulation layer on an obtained insulation layer. The manufacturing method of the multilayer substrate according to the present invention includes: a step of laminating the specific multilayer insulation film on a surface of a circuit board; a step of selectively and partially removing only the second insulation layer out of the first insulation layer and the second insulation layer to form the groove having a depth equal to the thickness of the second insulation layer on the obtained insulation layer; and a step of forming metal wiring within the groove formed on the insulation layer. Thus, a multilayer substrate can be obtained in which the groove having the depth equal to the thickness of the second insulation layer is accurately formed on the insulation layer, and the metal wiring having a shape corresponding to the shape of the groove is accurately formed within the groove.

In the multilayer insulation film according to the present invention, since the second insulation layer laminated on the one surface of the first insulation layer is configured such that, in partially removing the second insulation layer, only the second insulation layer out of the first insulation layer and the second insulation layer is enabled to be selectively removed to form a groove having a depth equal to the thickness of the second insulation layer on an obtained insulation layer, the groove having the depth equal to the thickness of the second insulation layer can be accurately formed on the obtained insulation layer.

DESCRIPTION OF EMBODIMENTS

Hereinafter, the present invention will be described in details.

Multilayer Insulation Film

A multilayer insulation film according to the present invention is used for forming an insulation layer having a groove. The multilayer insulation film according to the present invention is suitably used for forming an insulation layer in a multilayer substrate.

Figure 1:
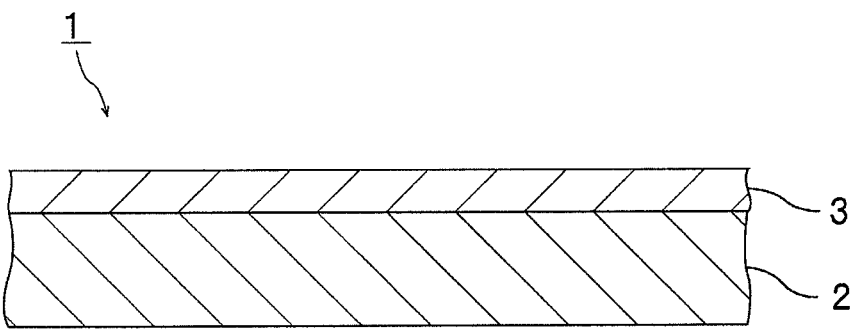
FIG. 1 is a cross-sectional view schematically showing a multilayer insulation film according to one embodiment of the present invention.

FIG. 1 is a cross-sectional view schematically showing a multilayer insulation film according to one embodiment of the present invention.

A multilayer insulation film 1 shown in FIG. 1 includes a first insulation layer 2 and a second insulation layer 3 laminated on one surface of the first insulation layer 2. The second insulation layer 3 is configured such that, in partially removing the second insulation layer 3, only the second insulation layer 3 out of the first insulation layer 2 and the second insulation layer 3 is enabled to be selectively removed to form a groove having a depth equal to the thickness of the second insulation layer 3 on an obtained insulation layer.

There is no particular limitation in a method for configuring the second insulation layer 3 such that, in partially removing the second insulation layer 3, only the second insulation layer 3 out of the first insulation layer 2 and the second insulation layer 3 is enabled to be selectively removed to form the groove having a depth equal to the thickness of the second insulation layer 3 on the obtained insulation layer. Examples of this method include: a method of making the first insulation layer harder than the second insulation layer; a method of using a multilayer insulation film in which only the first insulation layer out of the first insulation layer and the second insulation layer is enabled to be cured in a state of the multilayer insulation film; a method of using a multilayer insulation film in which only the first insulation layer out of the first insulation layer and the second insulation layer is enabled to be partially dissolved in a developer in development after exposure; and a method of enabling only the second insulation layer out of the first insulation layer and the second insulation layer to be melted and removed by irradiation of laser light, etc.

As described above, in the trenching process, it is difficult to highly accurately control the depth of a groove to be formed on an insulation layer. Thus, it is also difficult to highly accurately control the shape of a circuit pattern to be formed within the groove. This means that it is not possible to accurately keep an insulation distance between multilayer circuits. That is, if the depth of the groove varies, as compared to a necessary predetermined insulation distance, an insulation distance of a circuit formed in a deeply recessed groove with respect to a circuit at a lower layer is shorter, and an insulation distance of a circuit formed in a shallow groove with respect to the circuit at the lower layer is longer. Thus, the variation of the depth of the groove greatly affects insulation reliability.

In a situation expected in the future in which thinning of a package substrate advances, controlling the insulation distance to a designed certain value is desired more than ever.

In the present invention, a multilayer substrate can be obtained in which a groove having a depth equal to the thickness of the second insulation layer is accurately formed on an insulation layer and metal wiring having a shape corresponding to the shape of the groove is accurately formed within the groove.

Because of the above-described effect, it is possible to keep an interlayer insulation distance in the multilayer substrate uniform. That is, since the bottom of the groove is aligned with the boundary between the first insulation layer and the second insulation layer on the obtained insulation layer, an insulation distance between a pattern formed within the groove and a pattern at a lower layer located directly therebelow is kept uniform. Therefore, by providing the multilayer insulation film in which the respective thicknesses of the first insulation layer and the second insulation layer are adjusted, a desired insulation distance can be accurately achieved.

From a standpoint of further accurately forming a groove having a predetermined depth on the obtained insulation layer, the multilayer insulation film preferably enables the second insulation layer to be scraped or be melted in partially removing the second insulation layer. In partially removing the second insulation layer, the second insulation layer is preferably scraped or melted. In partially removing the second insulation layer, the second insulation layer is preferably scraped, and is also preferably melted.

In the case where only either one of the first insulation layer and the second insulation layer is enabled to be cured in a state of the multilayer insulation film, only the second insulation layer is enabled to be partially dissolved in a developer in development after exposure, or only the second insulation layer out of the first insulation layer and the second insulation layer is enabled to be melted and removed by irradiation of laser light; only the second insulation layer out of the first insulation layer and the second insulation layer is enabled to be selectively melted and removed to form the groove having a depth equal to the thickness of the second insulation layer on the obtained insulation layer.

From a standpoint of further accurately forming a groove having a predetermined depth on the obtained insulation layer, the second insulation layer is preferably configured such that, in partially removing the second insulation layer, only the second insulation layer out of the first insulation layer and the second insulation layer is enabled to be selectively scraped and removed to form the groove having a depth equal to the thickness of the second insulation layer on the obtained insulation layer.

From a standpoint of further accurately forming a groove having a predetermined depth on the obtained insulation layer, the first insulation layer is preferably made harder than the second insulation layer. In this case, when the multilayer insulation film is scraped from the second insulation layer side, it is possible to selectively remove only the second insulation layer out of the first insulation layer and the second insulation layer.

The hardnesses of the first and second insulation layers can be evaluated substitutively based on the glass transition temperature of each insulation layer measured with a differential scanning calorimeter (DSC), or with a viscoelastic spectrometer. In addition, the levels of the hardnesses can be determined by this evaluation.

The multilayer insulation film is preferably a multilayer insulation film in which only the second insulation layer out of the first insulation layer and the second insulation layer is enabled to be selectively removed when the multilayer insulation film is scraped form the second insulation layer side. The multilayer insulation film is preferably a multilayer insulation film in which only the second insulation layer out of the first insulation layer and the second insulation layer is enabled to be selectively removed when laser direct drawing is performed from the second insulation layer side. In these cases, since only the second insulation layer can be selectively removed, the groove having a depth equal to the thickness of the second insulation layer can be further accurately formed on the obtained insulation layer. When the multilayer insulation film is scraped from the second insulation layer side, the first insulation layer is preferably not removed.

For example, in the case where a resin component of the second insulation layer has higher absorption of laser wavelength light than a resin component of the first insulation layer, the resin component of the second insulation layer is more easily scraped.

From a standpoint of further accurately forming a groove having a predetermined depth on the obtained insulation layer, in the multilayer insulation resin film, the degree of crosslinking of the resin component in the first insulation layer is preferably higher than the degree of crosslinking of the resin component in the second insulation layer, or the contained amount of an inorganic filler in the first insulation layer is preferably more than the contained amount of an inorganic filler in the second insulation layer. The degree of crosslinking of the resin component in the first insulation layer is preferably higher than the degree of crosslinking of the resin component in the second insulation layer, and the contained amount of the inorganic filler in the first insulation layer is preferably more than the contained amount of the inorganic filler in the second insulation layer. In partially removing the second insulation layer, it is easy to make the first insulation layer harder than the second insulation layer, since the degree of crosslinking of the resin component in the first insulation layer is higher than the degree of crosslinking of the resin component in the second insulation layer and the contained amount of the inorganic filler in the first insulation layer is more than the contained amount of the inorganic filler in the second insulation layer.

The degree of crosslinking of the resin component in each of the first and second insulation layers can be evaluated substitutively based on the glass transition temperature of the resin measured with a differential scanning calorimeter (DSC), or with a viscoelastic spectrometer. In addition, the levels of the degrees of crosslinking can be determined by this evaluation.

Examples of a method for making the degrees of crosslinking of the resin components in the first and second insulation layers different from each other include a method of changing the composition of the resin or a curing agent, and a method of changing the amount of a curing accelerator, etc.

In order to enable only either one of the first insulation layer 2 and the second insulation layer 3 to be selectively melted and removed in partially removing the second insulation layer 3 to form the groove having a depth equal to the thickness of the second insulation layer 3 on the obtained insulation layer, preferably, 1) only either one of the first insulation layer and the second insulation layer is enabled to be cured in a state of the multilayer insulation film, 2) only the second insulation layer out of the first insulation layer and the second insulation layer is enabled to be partially dissolved in a developer in development after exposure, or 3) only the second insulation layer out of the first insulation layer and the second insulation layer is enabled to be melted and removed by irradiation of laser light. In this case as well, a multilayer substrate can be obtained in which a groove having a depth equal to the thickness of the second insulation layer is accurately formed on the insulation layer and metal wiring having a shape corresponding to the shape of the groove is accurately formed within the groove.

1) Only either one of the first insulation layer and the second insulation layer is preferably enabled to be cured in a state of the multilayer insulation film, 2) only the second insulation layer out of the first insulation layer and the second insulation layer is preferably enabled to be partially dissolved in a developer in development after exposure, and 3) only the second insulation layer is preferably enabled to be melted and removed by irradiation of laser light.

In the case where 1) only either one of the first insulation layer and the second insulation layer is enabled to be cured in a state of the multilayer insulation film, only the first insulation layer is preferably enabled to be cured. In the case where 1) only either one of the first insulation layer and the second insulation layer is enabled to be cured in a state of the multilayer insulation film, only the second insulation layer can be selectively cured by performing curing under a curing condition for curing the first insulation layer and partially curing the second insulation layer, or only the first insulation layer can be selectively cured by performing curing under a curing condition for not curing the second insulation layer and curing only the first insulation layer. In the first and second insulation layers having different cured states, the groove can be formed by partially melting and removing the second insulation layer. At that time, the second insulation layer may be partially cured, and an uncured second insulation layer portion may be melted and removed. In order to melt the uncured second insulation layer portion, development is preferably performed. Only the first insulation layer out of the first insulation layer and the second insulation layer is preferably enabled to be cured in a state of the multilayer insulation film. It should be noted that "only either one of the first insulation layer and the second insulation layer is cured" means that one insulation layer is cured more than the other insulation layer, and includes the case where curing of the other insulation layer advances such that the degree thereof is lower than that of the one insulation layer.

In the case where 2) only the second insulation layer out of the first insulation layer and the second insulation layer is enabled to be partially dissolved in a developer in development after exposure, the second insulation layer may be enabled to be selectively and partially removed by using the principles of exposure and development for the second insulation layer, regardless of whether the first and second insulation layers have been cured. For example, a portion irradiated with light through exposure preferably becomes soluble in the developer. By partially irradiating the second insulation layer with light through a mask, the second insulation layer can be made partially soluble in the developer.

In the case where 3) only the second insulation layer is enabled to be melted and removed by irradiation of laser light, only the second insulation layer can be selectively removed by irradiating the multilayer insulation film with laser light. In addition, the second insulation layer can be removed in a patterned shape by applying laser light in a patterned shape.

From a standpoint of further accurately forming a groove having a predetermined depth on the obtained insulation layer, in order to enable only either one of the first insulation layer and the second insulation layer to be cured in a state of the multilayer insulation film, preferably, 1-1) the first insulation layer contains a photoreactive component, and the second insulation layer contains a thermosetting component, 1-2) the first insulation layer contains a thermosetting component, and the second insulation layer contains a photoreactive component, 1-3) each of the first insulation layer and the second insulation layer contains a thermosetting component, and thermal curing conditions for curing the first insulation layer and the second insulation layer are different from each other, 1-4) each of the first insulation layer and the second insulation layer contains a photoreactive component, and photoreaction conditions for curing the first insulation layer and the second insulation layer are different from each other, or 2) only the second insulation layer out of the first insulation layer and the second insulation layer is enabled to be partially dissolved in a developer in development after exposure. Preferably, 1-1) the first insulation layer contains a photoreactive component, and the second insulation layer contains a thermosetting component, 1-2) the first insulation layer contains a thermosetting component, and the second insulation layer contains a photoreactive component, 1-3) each of the first insulation layer and the second insulation layer contains a thermosetting component, and thermal curing conditions for curing the first insulation layer and the second insulation layer are different from each other, or 1-4) each of the first insulation layer and the second insulation layer contains a photoreactive component, and photoreaction conditions for curing the first insulation layer and the second insulation layer are different from each other. 1-1) Preferably, the first insulation layer contains a photoreactive component, and the second insulation layer contains a thermosetting component, 1-2) preferably, the first insulation layer contains a thermosetting component, and the second insulation layer contains a photoreactive component, 1-3) preferably, each of the first insulation layer and the second insulation layer contains a thermosetting component, and thermal curing conditions for curing the first insulation layer and the second insulation layer are different from each other, and 1-4) preferably, each of the first insulation layer and the second insulation layer contains a photoreactive component, and photoreaction conditions for curing the first insulation layer and the second insulation layer are different from each other.

In the case where 1-1) the first insulation layer contains a photoreactive component and the second insulation layer contains a thermosetting component, only the second insulation layer can be selectively thermally cured by heating, or only the first insulation layer can be selectively photochemically reacted by irradiation of light. In the case where 1-2) the first insulation layer contains a thermosetting component and the second insulation layer contains a photoreactive component, only the second insulation layer can be selectively photochemically reacted by irradiation of light, or only the first insulation layer can be selectively thermally cured by heating. In the case where 1-3) each of the first insulation layer and the second insulation layer contains a thermosetting component and thermal curing conditions for curing the first insulation layer and the second insulation layer are different from each other, thermal curing can be performed under a condition for thermally curing only either one of the first insulation layer and the second insulation layer. In the case where 1-4) each of the first insulation layer and the second insulation layer contains a photoreactive component and photoreaction conditions for curing the first insulation layer and the second insulation layer are different from each other, only either one of the first insulation layer and the second insulation layer can be photochemically reacted by conducting a photoreaction under a condition for photochemically reacting only either one of the first insulation layer and the second insulation layer. In addition, the second insulation layer can be partially cured by partially irradiating the second insulation layer with light through a mask. Moreover, the second insulation layer can be partially cured by partially heating the second insulation layer. Then, an uncured second insulation layer portion can be removed by development.

Multilayer Substrate and Method for Manufacturing Multilayer Substrate

A multilayer substrate including an insulation layer having a groove can be obtained by using the above-described multilayer insulation film.

A multilayer substrate according to the present invention includes a circuit board, an insulation layer which is disposed on the circuit board and has a groove, and metal wiring which is formed within the groove. The insulation layer in the multilayer substrate according to the present invention is formed by using the above-described multilayer insulation film. The insulation layer may be laminated directly on the circuit board, or may be laminated indirectly thereon through another insulation layer.

Figure 2:
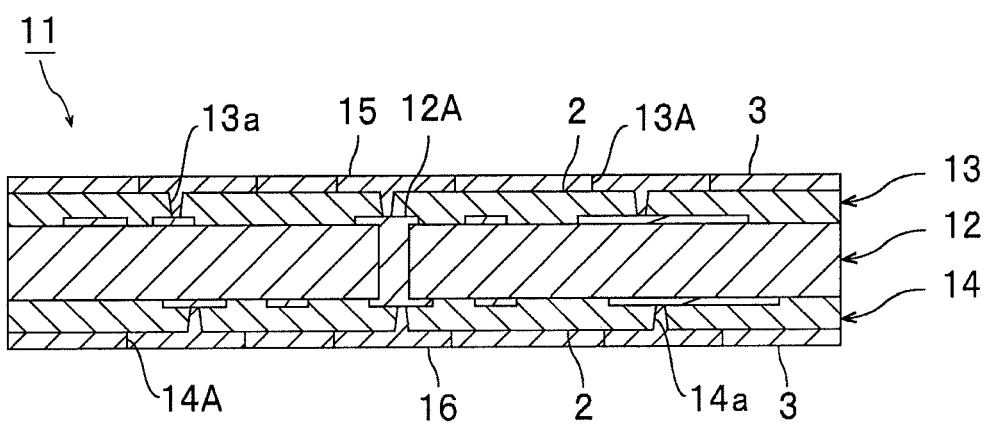
FIG. 2 is a cross-sectional view schematically showing a multilayer substrate using the multilayer insulation film according to the embodiment of the present invention.

FIG. 2 is a cross-sectional view schematically showing a multilayer substrate using the multilayer insulation film according to the embodiment of the present invention.

In a multilayer substrate 11 shown in FIG. 2, an insulation layer 13 is disposed on a first surface of a circuit board 12, and an insulation layer 14 is disposed on a second surface opposite to the first surface of the circuit board. The circuit board 12 has metal wiring 12A. The metal wiring 12A is exposed in some areas of the surface of the circuit board 12. The insulation layers 13 and 14 have grooves 13A and 14A on their surfaces opposite to the circuit board 12 side, respectively. Metal wiring 15 is formed within the groove 13A. Metal wiring 16 is formed within the groove 14A.

In a manufacturing method of the multilayer substrate according to the present invention, the above-described multilayer insulation film is used. That is, in the manufacturing method of the multilayer substrate according to the present invention, a multilayer insulation film is used which includes a first insulation layer and a second insulation layer laminated on one surface of the first insulation layer, the second insulation layer being configured such that, in partially removing the second insulation layer, only the second insulation layer out of the first insulation layer and the second insulation layer is enabled to be selectively removed to form the groove having a depth equal to the thickness of the second insulation layer on an obtained insulation layer.

The manufacturing method of the multilayer substrate according to the present invention includes: a step of laminating the multilayer insulation film on a surface of a circuit board; a step of selectively and partially removing only the second insulation layer out of the first insulation layer and the second insulation layer to form a groove having a depth equal to the thickness of the second insulation layer on an obtained insulation layer; and a step of forming metal wiring within the groove formed on the insulation layer.

In addition, in the manufacturing method of the multilayer substrate according to the present invention, a multilayer insulation film is preferably used in which the second insulation layer is configured such that, in partially removing the second insulation layer, only the second insulation layer out of the first insulation layer and the second insulation layer is enabled to be melted and selectively removed to form the groove having a depth equal to the thickness of the second insulation layer on the obtained insulation layer. In this case, in the multilayer insulation film, preferably, 1) only either one of the first insulation layer and the second insulation layer is enabled to be cured in a state of the multilayer insulation film, 2) only the second insulation layer out of the first insulation layer and the second insulation layer is enabled to be partially dissolved in a developer in development after exposure, or 3) only the second insulation layer is enabled to be melted and removed by irradiation of laser light.

By using the multilayer insulation film 1, the multilayer substrate 11 can be obtained, for example, as follows.

Figure 3A:
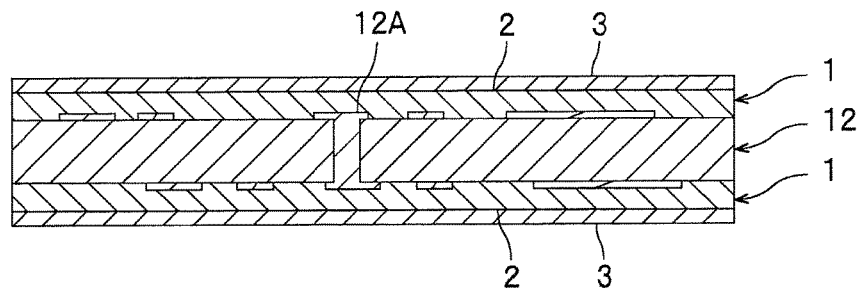
FIGS. 3(a) to 3(d) are schematic cross-sectional views for illustrating each step of a manufacturing method of the multilayer substrate using the multilayer insulation film according to the embodiment of the present invention.

First, as shown in FIG. 3(a), the multilayer insulation film 1 is laminated on the surface of the circuit board 12. The multilayer insulation film 1 is laminated on the surface of the circuit board 12 from the first insulation layer 2 side. Here, two multilayer insulation films 1 are laminated on the first surface of the circuit board 12 and the second surface opposite to the first surface, respectively. After the lamination, each multilayer insulation film 1 is preferably semi-cured or cured. In addition, in the case where the second insulation layer is selectively removed by development through a photoreaction, in some cases, it is better to perform semi-curing or curing by heat after the second insulation layer is selectively removed.

Figure 3B:
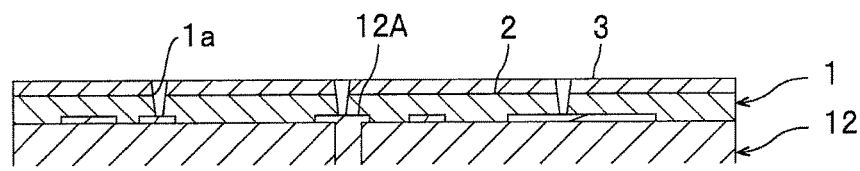

Next, as shown in FIG. 3(b), penetration holes 1a are formed in each multilayer insulation film 1 so as to extend to the metal wiring 12A and penetrate through the multilayer insulation film 1. Here, only a portion of a structure shown in FIG. 3 (a) is shown.

As each penetration hole described above, for example, a via, a through hole, or the like is formed. Examples of a method for forming the penetration hole in the multilayer insulation film include a method of applying ultraviolet rays, infrared laser, or $CO_2$ laser, and a method of forming a hole with a drill, etc. The diameter of the via is not particularly limited, and is about 30 to 120 μm.

Figure 3C:
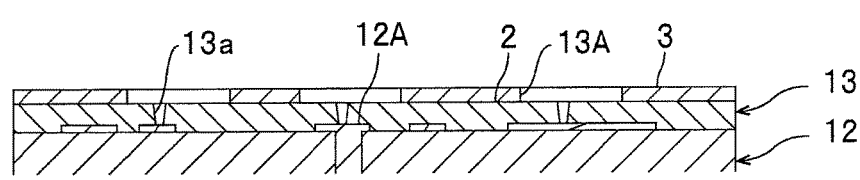

Next, as shown in FIG. 3(c), only the second insulation layer 3 out of the first insulation layer 2 and the second insulation layer 3 is selectively and partially removed to form the groove 13A having a depth equal to the thickness of the second insulation layer 3 on the obtained insulation layer 13. That is, only the second insulation layer 3 out of the first insulation layer 2 and the second insulation layer 3 is selectively and partially removed to form the insulation layer 13 having the groove 13A. The insulation layer 13 includes the first insulation layer 2 and the second insulation layer 3 having the groove 13A formed thereon. In addition, the insulation layer 13 has penetration holes 13a originated from the penetration holes 1a. Here, the first insulation layer 2 is not removed, only the second insulation layer 3 is removed, and thus the depth of the groove 13A is equal to the thickness of the second insulation layer 3.

Figure 4:
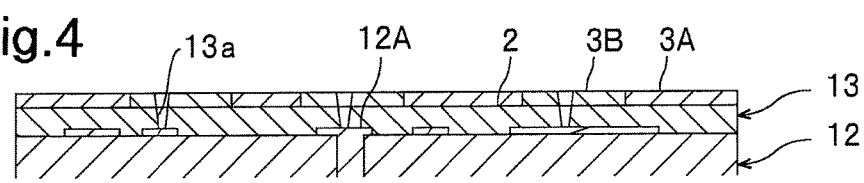
FIG. 4 is a schematic cross-sectional view for illustrating a modification of the manufacturing method of the multilayer substrate.

It should be noted that in the case where only the second insulation layer 3 is melted and selectively removed, in order to partially melt and remove the second insulation layer 3, as shown in FIG. 4, the second insulation layer 3 may be partially cured to form a cured second insulation layer portion 3A and an uncured second insulation layer portion 3B. Or, the second insulation layer 3 may be made partially soluble in a developer to form a soluble second insulation layer portion 3B and an insoluble second insulation layer portion 3A. By forming such second insulation layer portions 3A and 3B, it is made easy to partially melt and remove only the uncured second insulation layer portion 3B or only the second insulation layer portion 3B, which is made soluble in the developer, by development. In addition, in the case where the development is performed through a photo-reaction to form a groove, it is preferable in some cases to perform semi-curing or curing by heat and form vias after the second insulation layer portion 3B is removed.

Examples of a method for forming the groove 13A include: a method of partially scraping only the second insulation layer from the second insulation layer side of the multilayer insulation film; a method of curing the first insulation layer, partially curing the second insulation layer, and removing an uncured second insulation layer portion by development; a method of partially curing the first insulation layer without curing the second insulation layer, then partially curing the second insulation layer, and removing an uncured second insulation layer portion by development; a method of enabling only the second insulation layer out of the first insulation layer and the second insulation layer to be partially dissolved in a developer in development after exposure; a method of performing heating to a temperature at which only the second insulation layer melts or sublimates, to partially remove the second insulation layer; and a method of irradiating the second insulation layer with laser light, etc. In the development, a developer in which an insulation layer portion to be removed by the development is soluble is used.

Next, a desmear treatment is performed as necessary. By forming the penetration hole, a smear, which is a residue of resin derived from a resin component contained in the insulation layer, is often formed at the bottom within the via. In order to remove the smear, a desmear treatment is preferably performed. The desmear treatment sometimes also serves as a roughening treatment. For the desmear treatment, for example, a chemical oxidant such as a manganese compound, a chromium compound, or a persulfuric acid compound is used. Such chemical oxidants are added to water or an organic solvent, and used as an aqueous solution or an organic solvent dispersed solution. A desmear treatment liquid used for the desmear treatment generally contains an alkali. The desmear treatment liquid preferably contains sodium hydroxide.

Examples of the manganese compound include potassium permanganate and sodium permanganate, etc. Examples of the chromium compound include potassium dichromate and anhydrous potassium chromate, etc. Examples of the persulfuric acid compound include sodium persulfate, potassium persulfate, and ammonium persulfate, etc.

There is no particular limitation in the method for the desmear treatment. Suitable examples of the method for the desmear treatment include a method of treating a target object by using a 30 to 90 g/L permanganic acid or permanganate solution and a 30 to 90 g/L sodium hydroxide solution at a treatment temperature of 30 to 85° C. for 1 to 30 minutes. The desmear treatment is preferably performed once or twice. The temperature of the desmear treatment is preferably within a range of 50 to 85° C.

Figure 3D:
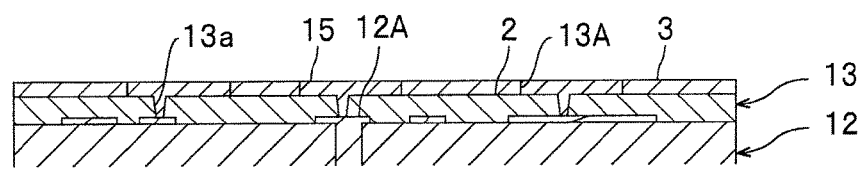

Next, as shown in FIG. 3(d), a metal is loaded into the groove 13A to form the metal wiring 15. Here, the metal wiring 15 is formed selectively only within the groove 13A and the penetration holes 13a. In addition, since the groove 13A is previously formed, the metal wiring 15 having a shape corresponding to the shape of the patterned groove 13A can be formed.

In order to selectively form the metal wiring within the groove of the insulation layer, a sensitizing step is preferably performed as necessary. As a result of the sensitizing, after a palladium catalyst is provided on the surface of the insulation layer, electroless plating is selectively performed on that portion, and an electrolysis plating is formed thereon, whereby a pattern can be formed. In the sensitizing step, specifically, the surface of the multilayer insulation film is delipidated and rinsed through treatment with an alkaline cleaner. After the rinsing, the multilayer insulation film is treated in a pre-dipping liquid, then the insulation layer is treated in an activator liquid, and the palladium catalyst is provided thereon. In this case, since the palladium catalyst is provided on the entire outer surface of the insulation layer 13, the surface is polished with a ceramic buff or the like to remove the palladium on the surface of the insulation layer other than the inside of the groove 13A and the penetration holes 13a, before advancing to the electroless plating step. By so doing, a plating pattern can be selectively formed within the groove 13A and the penetration holes 13a.

Figure 5:
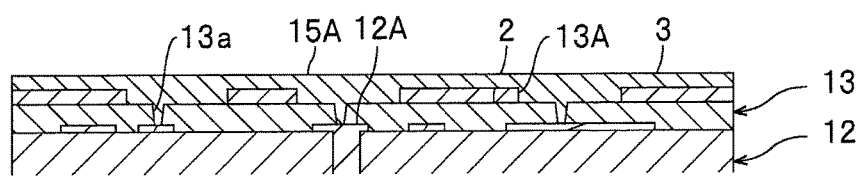
FIG. 5 is a schematic cross-sectional view for illustrating another modification of the manufacturing method of the multilayer substrate.

It should be noted that polishing with a ceramic buff may not be performed after the sensitizing, and as shown in FIG. 5, a metal may be loaded into the groove 13A and the penetration holes 13a and may be also laminated on the surface of the insulation layer 13 to form a metal layer 15A. In this case, the metal wiring 15 can be formed by partially removing the metal layer 15A through surface grinding, electric etching, or the like.

In addition, as for the multilayer insulation film 1 at the second surface side of the circuit board 12, by performing the same treatment as that on the multilayer insulation film 1 at the first surface side, the insulation layer 14 having the groove 14A and penetration holes 14a can be formed, and the metal wiring 16 can be formed within the insulation layer 14. In this manner, the multilayer substrate 11 shown in FIG. 2 can be obtained.

Details of Multilayer Insulation Film

Each of the first and second insulation layers which are components of the above-described multilayer insulation film is preferably formed from a resin composition which contains a thermosetting component, or is preferably formed from a resin composition which contains a photoreactive component. The thermosetting component preferably contains a thermosetting resin and a thermal curing agent. The photoreactive component preferably contains a photoreactive resin, and preferably contains a photoreaction initiator. Each of the first and second insulation layers which are components of the above-described multilayer insulation film is preferably formed from a resin composition (first or second resin composition) which contains a thermosetting resin and a thermal curing agent. The resin composition preferably contains an inorganic filler. Regarding the contained amount of the inorganic filler in 100 wt % of components excluding a solvent in the first insulation layer or the second insulation layer, the contained amount of the inorganic filler in the first insulation layer is preferably more than, more preferably more than by 5 wt % or more, further preferably more than by 10 wt % or more, and particularly preferably more than by 20 wt % or more, the contained amount of the inorganic filler in the second insulation layer. Therefore, the contained amount of the inorganic filler in 100 wt % of the components excluding the solvent in the first resin composition for forming the first insulation layer is preferably more than, more preferably more than by 5 wt % or more, further preferably more than by 10 wt % or more, and particularly preferably more than by 20 wt % or more, the contained amount of the inorganic filler in 100 wt % of the components excluding the solvent in the second resin composition for forming the second insulation layer.

Hereafter, each component included in the above-described resin composition will be described in details.

[Thermosetting Resin (Thermosetting Compound) (Thermosetting Component)]

Each of the resin composition and the first and second insulation layers preferably contains a thermosetting resin. There is no particular limitation in the thermosetting resin. Regarding the thermosetting resin, a single type may be used by itself, or a combination of two or more types may be used.

Examples of the thermosetting resin include epoxy resins, cyanate ester resins, phenolic resins, bismaleimide-triazine resins, polyimide resins, acrylic resins, and vinylbenzyl resins, etc. From a standpoint of making insulation property and mechanical strength further excellent, the thermosetting resin is preferably an epoxy resin.

Examples of the epoxy resin include bisphenol A type epoxy resins, bisphenol F type epoxy resins, bisphenol S type epoxy resins, phenol novolac type epoxy resins, biphenyl type epoxy resins, biphenyl novolac type epoxy resins, biphenol type epoxy resins, naphthalene type epoxy resins, fluorene type epoxy resins, phenol aralkyl type epoxy resins, naphthol aralkyl type epoxy resins, dicyclopentadiene type epoxy resins, anthracene type epoxy resins, epoxy resins having an adamantane backbone, epoxy resins having a tricyclodecane backbone, and epoxy resins having a triazine nucleus backbone, etc.

At ordinary temperature (23° C.), the epoxy resin may be liquid or solid. Each of the resin composition and the first and second insulation layers preferably contains an epoxy resin that is liquid at ordinary temperature (23° C.). In 100 wt % of components (hereinafter, sometimes described as component A) excluding the solvent and the inorganic filler contained in each of the resin composition and the first and second insulation layers, the contained amount of the epoxy resin that is liquid at ordinary temperature is preferably not less than 10 wt %, and more preferably not less than 25 wt %. If the contained amount of the epoxy resin that is liquid at ordinary temperature is equal to or more than the lower limit described above, it is easy to increase the contained amount of the inorganic filler in the multilayer insulation film. The total amount of the epoxy resin in the resin composition and the first and second insulation layers may be the epoxy resin that is liquid at ordinary temperature.

From a standpoint of further increasing the adhesive strength between the cured object and the metal wiring, an equivalent of a thermosetting functional group of the thermosetting resin is preferably not lower than 90 and more preferably not lower than 100, but preferably not higher than 1000 and more preferably not higher than 800. When the thermosetting resin is an epoxy resin, the equivalent of the thermosetting functional group represents an epoxy equivalent.

The molecular weight of the thermosetting resin is preferably not higher than 1000. In such a case, it is easy to increase the contained amount of the inorganic filler in the multilayer insulation film. Furthermore, even when the contained amount of the inorganic filler is large, a highly fluid resin composition is obtained. In addition, by using, in combination, a thermoplastic resin and the thermosetting resin whose molecular weight is not higher than 1000, excessive reduction of the melt viscosity of the multilayer insulation film is suppressed.

The molecular weight of the thermosetting resin and the molecular weight of a later described thermal curing agent, when the thermosetting resin or the thermal curing agent is not a polymer and when a structural formula of the thermosetting resin or the thermal curing agent can be specified, refer to a molecular weight that can be calculated from the structural formula. When the thermosetting resin or the thermal curing agent is a polymer, the molecular weight refers to a weight average molecular weight.

The weight average molecular weight described above represents a polystyrene-equivalent weight average molecular weight measured by gel permeation chromatography (GPC).

The whole contained amount of the thermosetting resin in 100 wt % of the component A is preferably not less than 10 wt % and more preferably not less than 20 wt %, but preferably not more than 95 wt % and more preferably not more than 80 wt %.

[Thermal Curing Agent (Thermosetting Component)]

Each of the resin composition and the first and second insulation layers preferably contains a thermal curing agent. There is no particular limitation in the thermal curing agent. Regarding the thermal curing agent, a single type may be used by itself, or a combination of two or more types may be used.

Examples of the thermal curing agent include cyanate ester compounds (cyanate ester thermal curing agents), phenolic compounds (phenol thermal curing agents), amine compounds (amine thermal curing agents), thiol compounds (thiol thermal curing agents), imidazole compounds, phosphine compounds, acid anhydrides, active ester compounds, and dicyandiamide, etc. Among those, from a standpoint of obtaining a cured object that has a smaller dimensional change by heat, the thermal curing agent is preferably a cyanate ester compound or a phenolic compound. As the thermal curing agent, a cyanate ester compound is preferable, and a phenolic compound is also preferable. The thermal curing agent preferably has a functional group capable of reacting with a thermosetting functional group of the thermosetting resin. The thermal curing agent preferably has a functional group capable of reacting with an epoxy group of the epoxy resin.

From a standpoint of further increasing the adhesive strength between the cured object and the metal wiring and forming further fine wiring on the surface of the cured object, the thermal curing agent is preferably a cyanate ester compound, a phenolic compound, or an active ester compound.

When the cyanate ester compound is used, the adhesive strength between the cured object and the metal wiring further increases. In addition, when the cyanate ester compound is used, handling of the multilayer insulation film having a large contained amount of the inorganic filler becomes excellent, and the glass transition temperature of the cured object further increases. There is no particular limitation in the cyanate ester compound. As the cyanate ester compound, a hitherto known cyanate ester compound can be used. Regarding the cyanate ester compound, a single type may be used by itself, or a combination of two or more types may be used.

Examples of the cyanate ester compound include novolac type cyanate ester resins, bisphenol type cyanate ester resins, and prepolymers obtained by partially trimerizing those, etc. Examples of the novolac type cyanate ester resins include phenol novolac type cyanate ester resins, and alkylphenol type cyanate ester resins, etc. Examples of the bisphenol type cyanate ester resins include bisphenol A type cyanate ester resins, bisphenol E type cyanate ester resins, and tetramethyl bisphenol F type cyanate ester resins, etc.

Examples of commercially available products of the cyanate ester compound include phenol novolac type cyanate ester resins ("PT-30" and "PT-60" manufactured by Lonza Japan Ltd.), and prepolymers ("BA-230S," "BA-3000S," "BTP-1000S," and "BTP-6020S" manufactured by Lonza Japan Ltd.) obtained by trimerizing bisphenol type cyanate ester resins.

The molecular weight of the cyanate ester compound is preferably not higher than 3000. In such a case, the contained amount of the inorganic filler in the multilayer insulation film can be increased, and, even when the contained amount of the inorganic filler is large, a highly fluid multilayer insulation film is obtained.

By using the phenolic compound, the adhesive strength between the cured object and the metal wiring is further increased. In addition, when the phenolic compound is used, for example, by performing a blacking process or a Cz process on the surface of copper wiring on the surface of the cured object, it is possible to further increase the adhesive strength between the cured object and the copper wiring.

There is no particular limitation in the phenolic compound. As the phenolic compound, a hitherto known phenolic compound can be used. Regarding the phenolic compound, a single type may be used by itself, or a combination of two or more types may be used.

Examples of the phenolic compound include novolac type phenols, biphenol type phenols, naphthalene type phenols, dicyclopentadiene type phenols, aralkyl type phenols, and dicyclopentadiene type phenols, etc.

Examples of commercially available products of the phenolic compound include novolac type phenols ("TD-2091" manufactured by DIC Corporation), biphenyl novolac type phenols ("MEH-7851" manufactured by Meiwa Plastic Industries, Ltd.), aralkyl type phenolic compounds ("MEH-7800" manufactured by Meiwa Plastic Industries, Ltd.), and phenols ("LA1356" and "LA3018-50P" manufactured by DIC Corporation) having an aminotriazine backbone, etc.

From a standpoint of further increasing the adhesive strength between the cured object and the metal wiring and forming further fine wiring on the surface of the cured object, the phenolic compound is preferably a biphenyl novolac type phenolic compound or an aralkyl type phenolic compound. From a standpoint of further reducing the surface roughness of the surface of the cured object, the phenolic compound preferably includes two or more phenolic hydroxyl groups.

There is no particular limitation in the active ester compound. Examples of commercially available products of the active ester compound include "HPC-8000," "HPC-8000-65T," and "EXB9416-70BK" manufactured by DIC Corporation.

From a standpoint of further increasing the adhesive strength between the cured object and the metal wiring, forming further fine wiring on the surface of the cured object, and providing excellent insulation reliability by the thermal curing agent, the thermal curing agent preferably contains a thermal curing agent whose equivalent is not higher than 250. The equivalent of the thermal curing agent represents, for example, a cyanate ester group equivalent when the thermal curing agent is a cyanate ester compound, a phenolic hydroxyl group equivalent when the thermal curing agent is a phenolic compound, and an active ester group equivalent when the thermal curing agent is an active ester compound.

In an entire 100 wt % of the thermal curing agent, the contained amount of the thermal curing agent whose equivalent is not higher than 250 is preferably not less than 30 wt % and more preferably not less than 50 wt %. The total amount of the thermal curing agent may be the thermal curing agent whose equivalent is not higher than 250. When the contained amount of the thermal curing agent whose equivalent is not higher than 250 is equal to or more than the lower limit described above, further fine wiring is formed on the surface of an insulation layer. Furthermore, when the contained amount of the thermal curing agent whose equivalent is not higher than 250 is equal to or more than the lower limit described above, the glass transition temperature of the cured object further increases.

The molecular weight of the thermal curing agent is preferably not higher than 1000. In such a case, even when the contained amount of the inorganic filler in 100 wt % of the components excluding the solvent in each of the resin composition and the first and second insulation layers is not less than 40 wt %, a highly fluid resin composition is obtained.

There is no particular limitation in the blend ratio of the thermosetting resin and the thermal curing agent. The blend ratio of the thermosetting resin and the thermal curing agent is appropriately determined depending on the types of the thermosetting resin and the thermal curing agent.

In 100 wt % of the component A, the contained amount of the total of the thermosetting resin and the thermal curing agent is preferably not less than 75 wt % and more preferably not less than 80 wt %, but preferably not more than 99 wt % and more preferably not more than 97 wt %.

[Photoreactive Resin (Photoreactive Compound) (Photoreactive Component)]

Each of the resin composition and the first and second insulation layers preferably contains a photoreactive resin. There is no particular limitation in the photoreactive resin. Regarding the photoreactive resin, a single type may be used by itself, or a combination of two or more types may be used.

Examples of the photoreactive resin include polybenzoxazole resins, etc. A photoreactive resin other than these resins may be used.

In addition, when using a combination of photo-curing and thermal curing is considered, a curing agent may be used which has a functional group which thermally cures with a thermosetting resin such as an epoxy resin and has a structure which produces a difference in solubility in a later development step between an irradiated portion and a non-irradiated portion in irradiation of light such as UV. Examples of such a material include "V-8000" manufactured by DIC Corporation, etc.

[Photoreaction Initiator (Photoreactive Component, Photosensitizer)]

Each of the resin composition and the first and second insulation layers contains a photoreaction initiator or does not contain a photoreaction initiator. There is no particular limitation in the photoreaction initiator. Regarding the photoreaction initiator, a single type may be used by itself, or a combination of two or more types may be used.

Examples of the photoreaction initiator include naphthoquinone diazide compounds, etc. A photoreaction initiator other than these compounds may be used. For example, when the above-described "V-8000" manufactured by DIC Corporation is used, by using a photoreaction initiator, change of the structure of the resin in UV irradiation is prompted. Examples of a photoreaction initiator that exhibits such a property include diazonaphthoquinone ("PC-5" manufactured by Toyo Gosei Co., Ltd.), etc.

In addition, as the photoreactive resin, a material which contains a photoreaction initiator may be used. Examples of such a material include "CRC-8800" manufactured by Sumitomo Bakelite Co., Ltd., etc.

There is no particular limitation in the contained amount of the photoreaction initiator. The photoreaction initiator is used in an adequate amount such that the photoreactive resin moderately reacts. The total contained amount of the photoreactive resin and the photoreaction initiator in 100 wt % of the component A is preferably not less than 75 wt %, and more preferably not less than 80 wt %. In addition, this does not apply when a combination of of photo-curing and thermal curing is used.

[Inorganic Filler]

Each of the resin composition and the first and second insulation layers contains an inorganic filler or does not contain an inorganic filler. Each of the resin composition and the first and second insulation layers preferably contains an inorganic filler. When the multilayer insulation film contains an inorganic filler, the thermal linear expansion coefficient of the cured object decreases, and the adhesive strength between the cured object and the metal wiring effectively increases. There is no particular limitation in the inorganic filler. Regarding the inorganic filler, a single type may be used by itself, or a combination of two or more types may be used.

Examples of the inorganic filler include silica, talc, clay, mica, hydrotalcite, alumina, magnesium oxide, aluminium hydroxide, aluminium nitride, and boron nitride, etc.

From a standpoint of further increasing the adhesive strength between the cured object and the metal wiring, forming further fine wiring on the surface of the cured object, and providing further excellent insulation reliability to the cured object, the inorganic filler is preferably silica or alumina, more preferably silica, and further preferably a fused silica. By using silica, the thermal linear expansion coefficient of the cured object further decreases, and the adhesive strength between the cured object and the metal wiring effectively increases. The form of the silica is preferably approximately a sphere.

The mean particle diameter of the inorganic filler is preferably not smaller than 10 nm, more preferably not smaller than 50 nm, and further preferably not smaller than 150 nm, but preferably not larger than 20 µm, more preferably not larger than 10 µm, further preferably not larger than 5 µm, and particularly preferably not larger than 1 µm. When the mean particle diameter of the inorganic filler is not smaller than the lower limit described above but not larger than the upper limit described above, the size of holes formed through the roughening treatment, the desmear treatment, or the like becomes fine, and the number of holes increases. As a result, the adhesive strength between the cured object and the metal wiring further increases. However, when a photoreaction is utilized, the mean particle diameter of the inorganic filler is preferably smaller than the wavelength of applied light in some cases.

As the mean particle diameter of the inorganic filler, a value of median diameter (d50) representing 50% is used. The mean particle diameter can be measured by using a particle-size-distribution measuring device utilizing laser diffraction dispersion method.

The inorganic filler is preferably spherical in form, and more preferably a spherical silica. In such a case, the adhesive strength between the cured object and the metal wiring effectively increases. When the inorganic filler is spherical, the aspect ratio of the inorganic filler is preferably not higher than 2 and more preferably not higher than 1.5.

The inorganic filler is preferably surface-treated, and more preferably surface-treated with a coupling agent. Thus, the adhesive strength between the cured object and the metal wiring further increases, further fine wiring is formed on the surface of the cured object, and further excellent inter-wiring insulation reliability and interlayer insulation reliability are provided to the cured object.

Examples of the coupling agent include silane coupling agents, titanate coupling agents, and aluminium coupling agents, etc. Examples of the silane coupling agents include methacrylic silane, acrylic silane, amino silane, imidazole silane, vinyl silane, and epoxy silane, etc.

In 100 wt % of the components excluding the solvent in the resin composition and the first and second insulation layers, the contained amount of the inorganic filler is preferably not less than 25 wt %, more preferably not less than 30 wt %, further preferably not less than 40 wt %, and particularly preferably not less than 50 wt %, but preferably not more than 90 wt %, more preferably not more than 85 wt %, and further preferably not more than 80 wt %. When the contained amount of the inorganic filler is not less than the lower limit described above but not more than the upper limit described above, the adhesive strength between the cured object and the metal wiring further increases, further fine wiring is formed on the surface of the cured object, and, with that amount of the inorganic filler, the thermal linear expansion coefficient of the cured object can be reduced to be comparable to that of metal copper.

[Thermoplastic Resin]

Each of the resin composition and the first and second insulation layers contains a thermoplastic resin or does not contain a thermoplastic resin. Each of the resin composition and the first and second insulation layers preferably contains a thermoplastic resin. There is no particular limitation in the thermoplastic resin. Regarding the thermoplastic resin, a single type may be used by itself, or a combination of two or more types may be used.

Examples of the thermoplastic resin include imide resins, phenoxy resins, polyvinyl acetal resins, rubber components, and organic fillers, etc. The thermoplastic resin is particularly preferably a phenoxy resin. By using the phenoxy resin, dispersibility of the inorganic filler becomes excellent since the melt viscosity is adjustable, and the multilayer insulation film is unlikely to wet and spread into an unintended area during the curing process. Furthermore, by using the thermoplastic resin, deterioration of embeddability of the multilayer insulation film with respect to holes or concavities and convexities of the circuit board is suppressed, and uneven distribution of the inorganic filler is prevented from occurring.

Examples of the phenoxy resin include phenoxy resins having backbones such as bisphenol A type backbones, bisphenol F type backbones, bisphenol S type backbones, biphenyl backbones, novolac backbones, naphthalene backbones, and imide backbones.

Examples of commercially available products of the phenoxy resin include "YP50," "YP55," and "YP70" manufactured by Nippon Steel & Sumikin Chemical Co., Ltd., and "1256B40," "4250," "4256H40," "4275," "YX6954BH30," and "YX8100BH30" manufactured by Mitsubishi Chemical Corp.

The weight average molecular weight of the thermoplastic resin is preferably not lower than 5000 but preferably not higher than 100000. The weight average molecular weight described above represents a polystyrene-equivalent weight average molecular weight measured by gel permeation chromatography (GPC).

There is no particular limitation in the contained amount of the thermoplastic resin. In 100 wt % of the component A, the contained amount of the thermoplastic resin (when the thermoplastic resin is a phenoxy resin, the contained amount of the phenoxy resin) is preferably not less than 1 wt % and more preferably not less than 5 wt %, but preferably not more than 30 wt %, more preferably not more than 20 wt %, and further more preferably not more than 15 wt %. When the contained amount of the thermoplastic resin is not less than the lower limit described above but not more than the upper limit described above, the thermal linear expansion coefficient of the cured object further decreases. In addition, embeddability of the multilayer insulation film with respect to holes or concavities and convexities of the circuit board becomes excellent. When the contained amount of the thermoplastic resin is not less than the lower limit described above, film-forming ability of the multilayer insulation film increases, and a further excellent cured object is obtained. When the contained amount of the thermoplastic resin is not more than the upper limit described above, the adhesive strength between the cured object and the metal wiring further increases.

[Curing Accelerator (Thermosetting Component)]

Each of the resin composition and the first and second insulation layers contains a curing accelerator or does not contain a curing accelerator. Each of the resin composition and the first and second insulation layers preferably contains a curing accelerator. By using the curing accelerator, a curing rate further increases. By quickly curing the multilayer insulation film, cross-link structures in the cured object become uniform, and a cross-link density increases as a result of a decrease in the number of unreacted functional groups. In addition, by making the contained amount of the curing accelerator in the first insulation layer more than the contained amount of the curing accelerator in the second insulation layer, even when the same type of resin is used, a difference can be produced between the first and second insulation layers in a speed of reaching a certain degree of crosslinking, that is, in a speed of reaching a certain degree of curing under the same curing (heating) condition. By utilizing this, the degree of curing of the first insulation layer can be made higher than the degree of curing of the second insulation layer at a stage of pre-curing. There is no particular limitation in the curing accelerator. Regarding the curing accelerator, a single type may be used by itself, or a combination of two or more types may be used.

Examples of the curing accelerator include imidazole compounds, phosphorus compounds, amine compounds, and organometallic compounds, etc.

Examples of the imidazole compound include 2-undecylimidazole, 2-heptadecylimidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecyl imidazolium trimellitate, 1-cyanoethyl-2-phenyl imidazolium trimellitate, 2,4-diamino-6-[2'-methyl imidazolyl-(1')]-ethyl-s-triazine, 2,4-diamino-6-[2'-undecyl imidazolyl-(1')]-ethyl-s-triazine, 2,4-diamino-6-[2'-ethyl-4'-methyl imidazolyl-(1')]-ethyl-s-triazine, adducts of 2,4-diamino-6-[2'-methyl imidazolyl-(1')]-ethyl-s-triazine isocyanuric acid, adducts of 2-phenylimidazole isocyanuric acid, adducts of 2-methylimidazole isocyanuric acid, 2-phenyl-4,5-dihydroxymethylimidazole, and 2-phenyl-4-methyl-5-dihydroxymethylimidazole, etc.

Examples of the phosphorus compounds include triphenyl phosphine, etc.

Examples of the amine compounds include diethylamine, triethylamine, diethylene tetramine, triethylenetetramine, and 4,4-dimethylaminopyridine, etc.

Examples of the organometallic compounds include zinc naphthenate, cobalt naphthenate, tin octylate, cobalt octylate, bis acetylacetonato cobalt(II), and tris acetylacetonato cobalt(III), etc.

There is no particular limitation in the contained amount of the curing accelerator. In 100 wt % of the component A, the contained amount of the curing accelerator is preferably not less than 0.01 wt % but preferably not more than 3 wt %. When the contained amount of the curing accelerator is not less than the lower limit described above but not more than the upper limit described above, the multilayer insulation film is cured efficiently.

[Solvent]

Each of the resin composition and the first and second insulation layers contains a solvent or does not contain a solvent. By using the solvent, the viscosity of the resin composition can be controlled within a suitable range, and the coatability of the resin composition can be increased. In addition, the solvent may be used for obtaining a slurry containing the inorganic filler. Regarding the solvent, a single type may be used by itself, or a combination of two or more types may be used.

Examples of the solvent include acetone, methanol, ethanol, butanol, 2-propanol, 2-methoxyethanol, 2-ethoxyethanol, 1-methoxy-2-propanol, 2-acetoxy-1-methoxypropane, toluene, xylene, methyl ethyl ketone, N,N-dimethylformamide, methyl isobutyl ketone, N-methyl-pyrrolidone, n-hexane, cyclohexane, cyclohexanone, and naphtha which is a mixture, etc.

Most of the solvent is preferably removed before or when curing the resin composition or the insulation layer. Thus, the boiling point of the solvent is preferably not higher than 200° C. and more preferably not higher than 180° C. There is no particular limitation in the contained amount of the solvent in the resin composition. The contained amount of the solvent can be changed as appropriate in consideration of the coatability of the resin composition.

[Other Components]

For the purpose of improving shock resistance, heat resistance, resin compatibility, and workability, etc.; a flame retardant, a coupling agent, a coloring agent, an antioxidant, an ultraviolet-ray-degradation inhibitor, a defoaming agent, a thickening agent, a thixotropic agent, and an absorber for various wavelengths, etc., may be added to each of the resin composition and the first and second insulation layers.

Examples of the coupling agent include silane coupling agents, titanium coupling agents, and aluminium coupling agents, etc. Examples of the silane coupling agents include vinyl silane, amino silane, imidazole silane, and epoxy silane, etc.

There is no particular limitation in the contained amount of the coupling agent. In 100 wt % of the component A, the contained amount of the coupling agent is preferably not less than 0.01 wt % but preferably not more than 5 wt %.

Examples of the absorber for various wavelengths include an ultraviolet absorber, etc. As the ultraviolet absorber, an ultraviolet absorber having an absorption band corresponding to the wavelength of an ultraviolet laser to be used can be selected as appropriate. Examples of the ultraviolet absorber include a cyanoacrylate compound and a benzophenone compound. For example, an ultraviolet absorber having absorption in the ultraviolet wavelength range of 200 to 380 nm is preferable, and an ultraviolet absorber having an absorption maximum in the ultraviolet wavelength range of 300 to 320 nm is particularly preferable.

Since the cyanoacrylate compound and the benzophenone compound each have an absorption maximum around 300 nm, by using the cyanoacrylate compound or the benzophenone compound, the processability of the cured object with an ultraviolet laser can be improved. The cyanoacrylate compound and the benzophenone compound are preferably compounds having good solubility in a solvent. However, it is desirable not to use a compound that contains chlorine in such an amount that electrical insulation property may deteriorate.

Regarding the ultraviolet absorber, a single type may be used by itself, or a combination of two or more types may be used. The contained amount of the ultraviolet absorber with respect to 100 parts by weight of the total of the thermosetting resin and the curing agent is preferably not less than 0.5 parts by weight, more preferably not less than 1 part by weight, and further preferably not less than 2.5 parts by weight, and is preferably not more than 50 parts by weight, more preferably not more than 30 parts by weight, and further preferably not more than 10 parts by weight. When the contained amount of the ultraviolet absorber is not less than the lower limit described above, the processability of the groove becomes further excellent. When the contained amount of the ultraviolet absorber is not less than 2.5 parts by weight, the processability of the groove remarkably increases. When the contained amount of the ultraviolet absorber is not more than the upper limit described above, the mechanical properties and electrical properties of the cured object become further excellent.

[Other Details of Multilayer Insulation Film]

Examples of the method for molding the resin composition into a film form include: an extrusion method of fusing, kneading, and extruding the resin composition using an extruder, and then molding the resin composition into a film form using a T-die or a circular die, etc.; a mold casting method of dissolving or dispersing the resin composition in a solvent, and then casting and molding an obtained mixture into a film form; and hitherto known other film molding methods, etc. Among those described above, the extrusion method or the mold casting method is preferable for the ability to support reduction in thickness. The film also includes a sheet. The film is a multilayer insulation film which includes first and second insulation layers. Examples of the multilayering method include: a method of attaching together two separately-molded films with a hot roll laminator or the like; a method of simultaneously or sequentially molding films at the time of coating or extrusion to form a multilayer insulation film; and hitherto known other multilayer insulation film molding methods, etc. Among those described above, the multilayer extrusion method or the multilayer mold casting method is preferable for the ability to be executed with the above film molding method.

A B stage film can be obtained by molding the resin composition into a film form, and heating and drying the resin composition under a condition of, for example, 90 to 200° C. for 1 to 180 minutes such that curing does not excessively advance due to the heat.

A film-form resin composition that can be obtained by the drying step as described above is referred to as a B stage film. The B stage film is a semi-cured object in a semi-cured state. The semi-cured object is not completely cured, and curing can be further advanced.

The B stage film may be a prepreg. Particularly, when only the first insulation layer is a prepreg, easiness of selectively scraping the second insulation layer with a laser or the like depends on presence/absence of a glass cloth. The B stage film may not be a prepreg.

In the multilayer insulation film, a base material is laminated on one surface thereof or both surfaces thereof, and the multilayer insulation film can be used in a state of a lamination film. The lamination film preferably includes the multilayer insulation film and a base material laminated on one surface or both surfaces of the multilayer insulation film.

Examples of the base material of the lamination film include polyester resin films such as polyethylene terephthalate films and polybutylene terephthalate films, olefin resin films such as polyethylene films and polypropylene films, polyimide resin films, and metallic foils such as copper foils and aluminium foils, etc. A surface treatment such as a release treatment, an antistatic treatment, or printing, etc. may be performed on the surface of the base material as necessary.

Hereinafter, the present invention will be described specifically with Examples. However, the present invention is not limited to the following Examples.

Thermosetting Resin (1) Bisphenol A type epoxy resin ("850-S" manufactured by DIC Corporation, epoxy equivalent: 187, solid content: 100 wt %.)

(2) Biphenyl type epoxy resin-containing liquid ("NC-3000-FH-75M" manufactured by Nippon Kayaku Co., Ltd., epoxy equivalent: 330. Contains 75 wt % solid content and 25 wt % methyl ethyl ketone.)

(3) Biphenyl type epoxy resin ("NC-3000" manufactured by Nippon Kayaku Co., Ltd., epoxy equivalent: 275, solid content: 100 wt %.)

Curing Agent (1) Cyanate ester curing agent-containing liquid ("BA-230S" manufactured by Lonza Japan Ltd., cyanate ester equivalent: 235. Contains 75 wt % solid content and 25 wt % methyl ethyl ketone.)

(2) Polyimide based curing agent-containing liquid ("V-8000" manufactured by DIC Corporation, and containing 40 wt % solid content and 60 wt % ethylene glycol acetate.)

Curing Accelerator (1) Imidazole compound (2-phenyl-4-methylimidazole; "2P4MZ" manufactured by Shikoku Chemicals Corp.)

Thermoplastic Resin (1) Phenoxy resin-containing liquid ("YX6954BH30" manufactured by Mitsubishi Chemical Corp., and containing 30 wt % solid content, 35 wt % methyl ethyl ketone, and 35 wt % cyclohexanone.)

Photoreactive Resin (1) Positive photosensitive polybenzoxazole resin ("CRC-8800" manufactured by Sumitomo Bakelite Co., Ltd., and containing 50 wt % solid content and 50 wt % γ-butyrolactone.)

(2) DNQ diazonaphthoquinone ("PC-5" manufactured by Toyo Gosei Co., Ltd., solid content: 100 wt %)

Ultraviolet Absorber (1) Cyanoacrylate compound ("Uvinul 3035" manufactured by BASF.)

Inorganic Filler (1) Spherical silica 1 (spherical silica obtained by surface-treating "SOC2" manufactured by Admatechs Co., Ltd., with a silane coupling agent ("KBM-573" manufactured by Shin-Etsu Chemical Co., Ltd.) having an N-phenyl-3-aminopropyl group; mean particle diameter: 0.5 μm.)

(2) Spherical silica 2 (spherical silica obtained by surface-treating "SOC1" manufactured by Admatechs Co., Ltd., with a silane coupling agent ("KBM-403" manufactured by Shin-Etsu Chemical Co., Ltd.) having a 3-glycidoxypropyl group; mean particle diameter: 0.25 μm.)

(3) Spherical silica 3 (spherical silica obtained by surface-treating "YC100C" manufactured by Admatechs Co., Ltd., with a methacryl silane coupling agent ("KBM-503" manufactured by Shin-Etsu Chemical Co., Ltd.); mean particle diameter: 0.10 μm.)

Solvent (1) Solvent (CHN, cyclohexanone, "037-05096" manufactured by Wako Pure Chemical Industries, Ltd.)

(2) Solvent (MEK, methyl ethyl ketone, "592-37021" manufactured by Wako Pure Chemical Industries, Ltd.)

Example 1

The following first resin composition varnish was prepared in order to obtain a first insulation layer of Example 1. With respect to 7.4 parts by weight of a cyanate ester curing agent-containing liquid ("BA-230S" manufactured by Lonza Japan Ltd.), 7.8 parts by weight of a bisphenol A type epoxy resin ("850-S" manufactured by DIC Corporation), 8.7 parts by weight of a biphenyl type epoxy resin-containing liquid ("NC-3000-FH-75M" manufactured by Nippon Kayaku Co., Ltd.), 0.3 parts by weight of an imidazole compound ("2P4MZ" manufactured by Shikoku Chemicals Corp.), 8.2 parts by weight of a phenoxy resin-containing liquid ("YX6954BH30" manufactured by Mitsubishi Chemical Corp.), 38.1 parts by weight of the spherical silica 1 (spherical silica obtained by surface-treating "SOC2" manufactured by Admatechs Co., Ltd., with a silane coupling agent ("KBM-573" manufactured by Shin-Etsu Chemical Co., Ltd.) having an N-phenyl-3-aminopropyl group), 6.5 parts by weight of the spherical silica 2 (spherical silica obtained by surface-treating "SOC1" manufactured by Admatechs Co., Ltd. with a silane coupling agent ("KBM-403" manufactured by Shin-Etsu Chemical Co., Ltd.) having a 3-glycidoxypropyl group), and 23.0 parts by weight of cyclohexanone ("037-05096" manufactured by Wako Pure Chemical Industries, Ltd.) were mixed, and the mixture was agitated at ordinary temperature until the mixture turned into a homogeneous solution, and thereby the first resin composition varnish was obtained.

The following second resin composition varnish was prepared in order to obtain a second insulation layer of Example 1. With respect to 11.9 parts by weight of a cyanate ester curing agent-containing liquid ("BA-230S" manufactured by Lonza Japan Ltd.), 12.6 parts by weight of a bisphenol A type epoxy resin ("850-S" manufactured by DIC Corporation), 14.0 parts by weight of a biphenyl type epoxy resin-containing liquid ("NC-3000-FH-75M" manufactured by Nippon Kayaku Co., Ltd.), 0.5 parts by weight of an imidazole compound ("2P4MZ" manufactured by Shikoku Chemicals Corp.), 13.1 parts by weight of a phenoxy resin-containing liquid ("YX6954BH30" manufactured by Mitsubishi Chemical Corp.), 26.2 parts by weight of the spherical silica 1 (spherical silica obtained by surface-treating "SOC2" manufactured by Admatechs Co., Ltd., with a silane coupling agent ("KBM-573" manufactured by Shin-Etsu Chemical Co., Ltd.) having an N-phenyl-3-aminopropyl group), 5.2 parts by weight of the spherical silica 2 (spherical silica obtained by surface-treating "SOC1" manufactured by Admatechs Co., Ltd. with a silane coupling agent ("KBM-403" manufactured by Shin-Etsu Chemical Co., Ltd.) having a 3-glycidoxypropyl group), and 16.5 parts by weight of cyclohexanone ("037-05096" manufactured by Wako Pure Chemical Industries, Ltd.) were mixed, and the mixture was agitated at ordinary temperature until the mixture turned into a homogeneous solution, and thereby the second resin composition varnish was obtained.

Each of the obtained first and second resin composition varnishes was individually applied, using an applicator, on a release-treated surface of a PET film ("XG284" manufactured by Toray Industries, Inc., thickness: 25 μm), and then the PET films were dried in a 100° C. gear oven for 2 minutes to volatilize solvents. In such manner, sheet-like formed bodies whose thicknesses were 15 μm and whose remaining levels of the solvents were not less than 1.0 wt % but not more than 4.0 wt % as the first insulation layer and the second insulation layer, respectively, were obtained on the PET films. The obtained two formed bodies ware attached together using a diaphragm type vacuum laminator ("MVLP-500" manufactured by Meiki Co., Ltd.), and thereby a multilayer insulation film in which the first insulation layer and the second insulation layer are laminated was obtained.

Examples 2 to 4, Comparative Example 1, and Reference Example 1

First and second resin composition varnishes and sheet-like formed bodies were obtained and multilayer insulation films were produced in a manner similar to Example 1, except for changing, as shown in Table 1 below, the type and blended amount (parts by weight) of the blended components that were used.

Example 5

The following first resin composition varnish was prepared in order to obtain a first insulation layer of Example 1. With respect to 11.9 parts by weight of a cyanate ester curing agent-containing liquid ("BA-230S" manufactured by Lonza Japan Ltd.), 12.6 parts by weight of a bisphenol A type epoxy resin ("850-S" manufactured by DIC Corporation), 14.0 parts by weight of a biphenyl type epoxy resin-containing liquid ("NC-3000-FH-75M" manufactured by Nippon Kayaku Co., Ltd.), 0.5 parts by weight of an imidazole compound ("2P4MZ" manufactured by Shikoku Chemicals Corp.), 13.1 parts by weight of a phenoxy resin-containing liquid ("YX6954BH30" manufactured by Mitsubishi Chemical Corp.), 26.2 parts by weight of the spherical silica 1 (spherical silica obtained by surface-treating "SOC2" manufactured by Admatechs Co., Ltd., with a silane coupling agent ("KBM-573" manufactured by Shin-Etsu Chemical Co., Ltd.) having an N-phenyl-3-aminopropyl group), 5.2 parts by weight of the spherical silica 2 (spherical silica obtained by surface-treating "SOC1" manufactured by Admatechs Co., Ltd. with a silane coupling agent ("KBM-403" manufactured by Shin-Etsu Chemical Co., Ltd.) having a 3-glycidoxypropyl group), and 16.6 parts by weight of cyclohexanone ("037-05096" manufactured by Wako Pure Chemical Industries, Ltd.) were mixed, and the mixture was agitated at ordinary temperature until the mixture turned into a homogeneous solution, and thereby the first resin composition varnish was obtained.

The following second resin composition varnish was prepared in order to obtain a second insulation layer of Example 1. With respect to 3.2 parts by weight of a cyanate ester curing agent-containing liquid ("BA-230S" manufactured by Lonza Japan Ltd.), 3.3 parts by weight of a bisphenol A type epoxy resin ("850-S" manufactured by DIC Corporation), 3.8 parts by weight of a biphenyl type epoxy resin-containing liquid ("NC-3000-FH-75M" manufactured by Nippon Kayaku Co., Ltd.), 0.1 parts by weight of an imidazole compound ("2P4MZ" manufactured by Shikoku Chemicals Corp.), 47.4 parts by weight of a positive photosensitive polybenzoxazole resin ("CRC-8800" manufactured by Sumitomo Bakelite Co., Ltd.), 23.7 parts by weight of the spherical silica 1 (spherical silica obtained by surface-treating "SOC2" manufactured by Admatechs Co., Ltd., with a silane coupling agent ("KBM-573" manufactured by Shin-Etsu Chemical Co., Ltd.) having an N-phenyl-3-aminopropyl group), 4.2 parts by weight of the spherical silica 2 (spherical silica obtained by surface-treating "SOC1" manufactured by Admatechs Co., Ltd. with a silane coupling agent ("KBM-403" manufactured by Shin-Etsu Chemical Co., Ltd.) having a 3-glycidoxypropyl group), and 14.2 parts by weight of cyclohexanone ("037-05096" manufactured by Wako Pure Chemical Industries, Ltd.) were mixed, and the mixture was agitated at ordinary temperature until the mixture turned into a homogeneous solution, and thereby the second resin composition varnish was obtained.

Each of the obtained first and second resin composition varnishes was individually applied, using an applicator, on a release-treated surface of a PET film ("XG284" manufactured by Toray Industries, Inc., thickness: 25 and then the PET films were dried in a 100° C. gear oven for 2 minutes to volatilize solvents. In such manner, sheet-like formed bodies (insulating resin materials) whose thicknesses were 15 μm as the first insulation layer and the second insulation layer, respectively, and whose remaining levels of solvent were not less than 1.0 wt % but not more than 4.0 wt % were obtained on the PET films. The obtained two formed bodies ware attached together using a diaphragm type vacuum laminator ("MVLP-500" manufactured by Meiki Co., Ltd.), and thereby a multilayer film in which the first insulation layer and the second insulation layer are laminated was obtained.

Example 6, Comparative Example 2, and Reference Example 2

First and second resin composition varnishes and sheet-like formed bodies were obtained and multilayer insulation films were produced in a manner similar to Example 5, except for changing, as shown in Table 2 below, the type and blended amount (parts by weight) of the blended components that were used.

Production of Evaluation Board
Substrate Treatment of Laminated Plate:

Both surfaces of a glass epoxy substrate ("CS-3665" manufactured by Risho Kogyo Co., Ltd.) having an internal layer circuit formed thereon through etching were immersed in a copper surface roughing agent ("MECetchBOND CZ-8100" manufactured by MEC Co., Ltd.) for the roughening treatment of copper surfaces.

Lamination:

The obtained multilayer insulation film was set such that the first insulation layer was in contact with the substrate-treated glass epoxy substrate, and was attached (laminated) thereon using a diaphragm type vacuum laminator ("MVLP-500" manufactured by Meiki Co., Ltd.). The lamination was performed by decompressing for 20 seconds to an atmospheric pressure of 13 hPa or lower, and pressing for 20 seconds at a temperature of 100° C. with a pressure of 0.8 MPa.

Curing of Multilayer Insulation Film:

Next, in Examples 1 to 4, Comparative Examples 1 and 2, and Reference Examples 1 and 2, the sheet-like formed bodies were cured at 150° C. for 60 minutes to obtain lamination samples. In Example 5, the sheet-like formed body was cured at 120° C. for 4 minutes to obtain a lamination sample. In Example 6, a lamination sample was obtained without performing thermal curing.

Formation of Groove

Regarding Examples 1 to 4 and Comparative Examples 1 and 2, a laser beam having a wavelength of 355 nm was applied to the multilayer insulation film from the second insulation layer side using an ultraviolet laser beam machine (manufactured by Hitachi Via Mechanics, Ltd.) with a pulse frequency of 30 kHz and an output of 0.04 mJ at a shot number of 10, to form a groove having a width of 20 μm and a depth of 15 μm (=the thickness of the second insulation layer) thereon with an inter-wiring distance of 20 μm, and thereby a groove for a circuit pattern was formed.

Regarding Example 5, exposure and development were performed under the following conditions to form a groove having a width of 20 μm and a depth of 15 μm (=the thickness of the second insulation layer) with an inter-wiring distance of 20 μm, and then curing was performed at 150° C. for 60 minutes.

The exposure/development conditions were set as follows.

Developer: TMAH (tetramethylammonium hydroxide) aqueous solution, rinse: pure water, exposure: irradiation of 354 nm ultraviolet rays with 200 mJ/cm$^2$, development: puddle type 50 seconds.

Regarding Example 6, exposure and development were performed under the following conditions to form a groove having a width of 20 μm and a depth of 15 μm (=the thickness of the second insulation layer) with an inter-wiring distance of 20 μm, and then curing was performed at 170° C. for 30 minutes.

The exposure/development conditions were set as follows.

Developer: TMAH (tetramethylammonium hydroxide), rinse: pure water, exposure: irradiation of 354 nm ultraviolet rays with 500 mJ/cm$^2$, development: puddle type 180 seconds (50° C.).

Desmear/Roughening Treatment:

In Examples 1 to 6 and Comparative Examples 1 and 2, the lamination sample having the groove formed thereon was placed in a 60° C. swelling liquid (an aqueous solution containing "Swelling Dip Securiganth P" manufactured by Atotech Japan K. K., and "sodium hydroxide" manufactured by Wako Pure Chemical Industries, Ltd.), and was shaken at a swelling temperature of 60° C. for 20 minutes. Then, the lamination sample was rinsed with pure water.

The lamination sample having the swelling treatment performed thereon was placed in an 80° C. sodium permanganate roughing solution ("Concentrate Compact CP" manufactured by Atotech Japan K. K., "sodium hydroxide" manufactured by Wako Pure Chemical Industries, Ltd.), and was shaken at a roughening temperature of 80° C. for 20 minutes. Then, the lamination sample was rinsed in a 40° C. rinsing liquid ("Reduction Securiganth P" manufactured by Atotech Japan K. K., "sulfuric acid" manufactured by Wako Pure Chemical Industries, Ltd.) for 10 minutes, and further rinsed in pure water. In the manner described above, the desmear/roughening treatment was performed on the surface layer of the cured object and the inner surface of the circuit pattern groove.

Sensitizing Treatment:

Regarding Examples 1 to 6 and Comparative Examples 1 and 2, the surface of the desmear/roughening-treated cured object was delipidated and rinsed through treatment using a 60° C. alkaline cleaner ("Cleaner Securiganth 902" manufactured by Atotech Japan K. K.) for 5 minutes. After the cured object was rinsed, the cured object was treated for 2 minutes in a 25° C. pre-dipping liquid ("Predip Neoganth B" manufactured by Atotech Japan K. K.). Then, the cured object was treated for 5 minutes in a 40° C. activator liquid ("Activator Neoganth 834" manufactured by Atotech Japan K. K.), and a palladium catalyst was provided thereon. Next, the cured object was treated for 5 minutes in a 30° C. reduction liquid ("Reducer Neoganth WA" manufactured by Atotech Japan K. K.).

Plating Process:

Next, regarding Examples 1 to 6 and Comparative Examples 1 and 2, the cured object was placed in a chemically copper enriched liquid ("Basic Printoganth MSK-DK," "Copper Printoganth MSK," "Stabilizer Printoganth MSK," and "Reducer Cu," all manufactured by Atotech Japan K. K.) to provide thereto electroless plating until a plating thickness of about 0.5 μm was achieved. After the electroless plating, in order to remove residual hydrogen gas, annealing was performed for 30 minutes at a temperature of 120° C. In all processes to the process of the electroless plating, the treatment liquids each having a volume of 2 L were used in a beaker scale, and each process was performed while shaking the cured object.

Next, electrolysis plating was applied to the cured object on which the electroless plating-process had been performed until the electrolysis plating filled the circuit pattern groove. As electrolytic copper plating, a copper sulfate solution ("copper sulfate pentahydrate" manufactured by Wako Pure Chemical Industries, Ltd., "sulfuric acid" manufactured by Wako Pure Chemical Industries, Ltd., "Basic Leveler Cupracid HL" manufactured by Atotech Japan K. K., and "Correction Agent Cupracid GS" manufactured by Atotech Japan K. K.) was used, and the electrolysis plating was performed by passing a current of 0.6 A/cm$^2$ until a plating thickness of about 25 μm was achieved. After the copper plating-process, the cured object was heated for 2 hours at 190° C. to further cure the cured object. Only in Example 5, the cured object was then further cured at 270° C. for 30 minutes. In addition, only in Example 6, the cured object was then further cured at 200° C. for 2 hours. In the manner described above, the cured object having the copper plating layer laminated on the upper surface thereof was obtained.

Formation of Pattern:

Regarding Examples 1 to 6 and Comparative Examples 1 and 2, of the formed copper plating layer, the copper other than that within the pattern groove was polished, and the multilayer insulation film was attached thereon such that the first insulation layer faced the substrate side by the above-described method for the lamination, and was cured at 150° C. for 60 minutes and next at 190° C. for 2 hours to obtain an evaluation board.

Regarding Reference Examples 1 and 2, as a step after curing the multilayer insulation film, a general semi-additive process (SAP) was performed to obtain an evaluation board having a groove formed thereon with a line width of 20 μm, a height of 15 μm, and an inter-wiring distance of 20 μm, similarly to Examples 1 to 6 and Comparative Examples 1 and 2.

Evaluation

1) Electrical Insulation Property

Using the obtained evaluation board, a voltage of 6 V was applied for 100 hours, and an insulation ratio A was measured with an insulation resistance tester. Furthermore, a voltage of 6 V was applied for 100 hours in an environment of 130° C. and a humidity of 85%, and an insulation ratio B was measured with the insulation resistance tester. Moreover, after the voltage application, the sample was cut, and a cross section thereof was evaluated by microscopic observation for whether migration had occurred between electrodes. The evaluation was determined as excellent (○) if B was maintained at a value equal to or higher than 75% of A and no migration had occurred, and was determined as bad (x) if B was less than 75% of A or migration had occurred.

2) Pattern Formability (Evaluation of Groove Depth)

In the sample cross section observation performed in the migration evaluation for electrical insulation property, the distance by which the bottom of the copper pattern was separated from the boundary between the first insulation layer and the second insulation layer in the thickness direction (up/down direction) was measured. Pattern cross sections at 10 locations were observed, and the evaluation was determined as excellent (○) if all separated distances were within ±1.5 μm, was determined as usable (Δ) if at least one of the separated distances exceeded ±1.5 μm but all the separated distances were within ±2.0 μm, and was determined as bad (x) if at least one of the separated distances exceeded ±2.0 μm.

Regarding Reference Examples 1 and 2, the above evaluation was impossible due to the board structure, thus after the pattern formation, a desmear treatment was performed on the multilayer insulation film laminated thereon, and the positions of the upper surface thereof (the upper surface of the second insulation layer) and the upper surface of the pattern were evaluated based on the same criteria as described above.

3) Undulation

In the obtained evaluation board, waviness (undulation) caused by the pattern on the upper surface of the board was measured with a surface roughness meter ("SJ-301" manufactured by Mitutoyo Corporation). The evaluation was determined as excellent (○) if the difference between the maximum value and the minimum value of measured values was not greater than 1.0 μm, was determined as usable (Δ) if the difference exceeded 1.0 μm and was not greater than 2.0 μm, and was determined as bad (x) if the difference exceeded 2.0 μm.

Regarding Tg (glass transition temperature) after pre-curing in Table 1, a value is shown which was obtained by measurement with a differential scanning calorimeter (DSC "Q2000" manufactured by TA Instruments) using powder that was obtained by scraping, with a file, the resin from each of the first and second insulation layers of the obtained multilayer insulation film that had been solely cured under the same conditions as those for pre-curing (150° C. for 60 minutes).

The results are shown in Tables 1 and 2 below. Each column of Blended components shows the compositions of the first and second resin composition varnishes for forming the first and second insulation layers.

TABLE 1

| | | Example 1 | | Example 2 | | Example 3 | | Example 4 | | Comparative Example 1 | | Reference Example 1 | |
|---|---|---|---|---|---|---|---|---|---|---|---|---|---|
| | | Two layers | | Two layers | | Two layers | | Two layers | | Two layers | | Two layers | |
| | | First insulation layer | Second insulation layer | First insulation layer | Second insulation layer | First insulation layer | Second insulation layer | First insulation layer | Second insulation layer | First insulation layer | Second insulation layer | First insulation layer | Second insulation layer |
| Blended components (wt %) | Thermosetting resin (1) 850-S | 7.8 | 12.6 | 7.8 | 9.2 | 7.8 | 9.0 | 7.8 | 9.0 | 12.6 | 12.6 | 7.8 | 12.6 |
| | (2) NC-3000-FH-75M | 8.7 | 14.0 | 8.7 | 10.2 | 8.7 | 10.0 | 8.7 | 10.0 | 14.0 | 14.0 | 8.7 | 14.0 |
| | Curing agent (1) BA-230S | 7.4 | 11.9 | 7.4 | 8.7 | 7.4 | 8.5 | 7.4 | 8.5 | 11.9 | 11.9 | 7.4 | 11.9 |
| | Curing accelerator (1) 2P4MZ | 0.3 | 0.5 | 0.3 | 0.4 | 1.0 | 0.4 | 0.3 | 0.4 | 0.5 | 0.5 | 0.3 | 0.5 |
| | Thermoplastic resin (1) YX6954BH30 | 8.2 | 13.1 | 8.2 | 9.6 | 8.1 | 9.4 | 8.2 | 9.4 | 13.1 | 13.1 | 8.2 | 13.1 |
| | Ultraviolet absorber (1) Uvinul 3035 | 0.0 | 0.0 | 0.0 | 0.0 | 0.0 | 0.0 | 0.0 | 1.9 | 0.0 | 0.0 | 0.0 | 0.0 |
| | Inorganic filler (1) SOC2/KBM-573 | 38.1 | 26.2 | 38.1 | 34.5 | 37.9 | 35.1 | 38.1 | 33.8 | 26.2 | 26.2 | 38.1 | 26.2 |
| | (3) SOC1/KBM-403 | 6.5 | 5.2 | 6.5 | 6.4 | 6.5 | 6.3 | 6.5 | 6.3 | 5.2 | 5.2 | 6.5 | 5.2 |
| | Solvent (1) CHN, 037-05096 | 23.0 | 16.5 | 23.0 | 21.0 | 22.8 | 21.3 | 23.0 | 20.7 | 16.5 | 16.5 | 23.0 | 16.5 |
| | Contained amount of inorganic filler in 100 wt % of components excluding solvent (wt %) | 66 | 46 | 66 | 61 | 66 | 61 | 66 | 61 | 46 | 46 | 66 | 46 |
| | Tg (° C.) after pre-curing (150° C. × 60 min) | 96 | 96 | 96 | 96 | 136 | 96 | 96 | 96 | 96 | 96 | 96 | 96 |
| | Process used for producing evaluation board | Trenching | | Trenching | | Trenching | | Trenching | | Trenching | | SAP | |
| | Laser type | UV | | UV | | UV | | UV | | UV | | UV | |
| Evaluation | (1) Electrical insulation property | ○ | | ○ | | ○ | | ○ | | x | | ○ | |
| | (2) Pattern formability (evaluation of groove depth) | ○ | | Δ | | ○ | | ○ | | x | | Δ | |
| | (3) Undulation | ○ | | ○ | | ○ | | ○ | | ○ | | x | |

TABLE 2

|  |  |  | Example 5 | | Example 6 | | Comparative Example 2 | | Reference Example 2 | |
|---|---|---|---|---|---|---|---|---|---|---|
|  |  |  | Layer configuration | | | | | | | |
|  |  |  | Two layers | | Two layers | | Two layers | | Two layers | |
|  |  |  | First insulation layer | Second insulation layer | First insulation layer | Second insulation layer | First insulation layer | Second insulation layer | First insulation layer | Second insulation layer |
| Blended components (wt %) | Thermosetting resin | (1) 850-S | 12.6 | 3.3 | 12.6 | 0.0 | 12.6 | 12.6 | 12.6 | 12.6 |
|  |  | (2) NC-3000-FH-75M | 14.0 | 3.8 | 14.0 | 0.0 | 14.0 | 14.0 | 14.0 | 14.0 |
|  |  | (3) NC-3000 | 0.0 | 0.0 | 0.0 | 8.3 | 0.0 | 0.0 | 0.0 | 0.0 |
|  | Curing agent | (1) BA-230S | 11.9 | 3.2 | 11.9 | 0.0 | 11.9 | 11.9 | 11.9 | 11.9 |
|  |  | (2) V-8000 | 0.0 | 0.0 | 0.0 | 35.0 | 0.0 | 0.0 | 0.0 | 0.0 |
|  | Curing accelerator | (1) 2P4MZ | 0.5 | 0.1 | 0.5 | 0.0 | 0.5 | 0.5 | 0.5 | 0.5 |
|  | Thermoplastic resin | (1) YX6954BH30 | 13.1 | 0.0 | 13.1 | 0.0 | 13.1 | 13.1 | 13.1 | 13.1 |
|  | Photoreactive resin | (1) CRC-8800 | 0.0 | 47.4 | 0.0 | 0.0 | 0.0 | 0.0 | 0.0 | 0.0 |
|  |  | (2) PC-5 | 0.0 | 0.0 | 0.0 | 2.8 | 0.0 | 0.0 | 0.0 | 0.0 |
|  | Inorganic filler | (1) SOC2/KBM-573 | 26.2 | 23.7 | 26.2 | 0.0 | 26.2 | 26.2 | 26.2 | 26.2 |
|  |  | (2) SOC1/KBM-403 | 5.2 | 4.2 | 5.2 | 0.0 | 5.2 | 5.2 | 5.2 | 5.2 |
|  |  | (3) YC100C/KBM-503 | 0.0 | 0.0 | 0.0 | 20.6 | 0.0 | 0.0 | 0.0 | 0.0 |
|  | Solvent | (1) CHN, 037-05096 | 16.6 | 14.2 | 16.5 | 0.0 | 16.5 | 16.5 | 16.6 | 16.5 |
|  |  | (2) MEK, 592-37021 | 0.0 | 0.0 | 0.0 | 33.3 | 0.0 | 0.0 | 0.0 | 0.0 |
| Contained amount of inorganic filler in 100 wt % of components excluding solvent | | | 46 | 46 | 46 | 46 | 46 | 46 | 46 | 46 |
| Board production process | | | Trenching | | Trenching | | Trenching | | SAP | |
| Evaluation | (1) Electrical insulation property | | ○ | | ○ | | x | | ○ | |
|  | (2) Position of groove bottom from boundary between first and second insulation layers | | ○ | | ○ | | x | | Δ | |
|  | (3) Undulation | | ○ | | ○ | | ○ | | x | |

DESCRIPTION OF THE REFERENCE CHARACTERS 1 multilayer insulation film
1a penetration hole
2 first insulation layer
3 second insulation layer
3A cured second insulation layer portion
3B uncured second insulation layer portion
11 multilayer substrate
12 circuit board
12A metal wiring
13, 14 insulation layer
13A, 14A groove
13a, 14a penetration hole
15, 16 metal wiring
15A metal layer

The invention claimed is:

1. A manufacturing method of a multilayer substrate, using a multilayer insulation film which includes a first insulation layer and a second insulation layer laminated on one surface of the first insulation layer, the second insulation layer being configured such that, in partially removing the second insulation layer, only the second insulation layer out of the first insulation layer and the second insulation layer is enabled to be melted and selectively removed by irradiation of laser light to form a groove having a depth equal to a thickness of the second insulation layer on an obtained insulation layer, the manufacturing method comprising:
a step of laminating the multilayer insulation film on a surface of a circuit board;
a step of selectively melting and partially removing only the second insulation layer out of the first insulation layer and the second insulation layer to form the groove having a depth equal to the thickness of the second insulation layer on the obtained insulation layer; and
a step of forming metal wiring within the groove formed on the insulation layer.

2. The manufacturing method of the multilayer substrate according to claim 1, wherein the first insulation layer is made harder than the second insulation layer in partially removing the second insulation layer.

3. The manufacturing method of the multilayer substrate according to claim 1, wherein
a degree of crosslinking of a resin component in the first insulation layer is made higher than a degree of crosslinking of a resin component in the second insulation layer in partially removing the second insulation layer, or
a contained amount of an inorganic filler in the first insulation layer is more than a contained amount of an inorganic filler in the second insulation layer.

4. A multilayer insulation film used for forming an insulation layer having a groove, the multilayer insulation film comprising:
a first insulation layer; and
a second insulation layer laminated on one surface of the first insulation layer, wherein
the second insulation layer is configured such that, in partially removing the second insulation layer, only the second insulation layer out of the first insulation layer and the second insulation layer is enabled to be melted and selectively removed by irradiation of laser light to form a groove having a depth equal to a thickness of the second insulation layer on an obtained insulation layer.

5. The multilayer insulation film according to claim 4, wherein the first insulation layer is harder than the second insulation layer.

6. The multilayer insulation film according to claim 4, wherein a degree of crosslinking of a resin component in the first insulation layer is higher than a degree of crosslinking of a resin component in the second insulation layer, or a contained amount of an inorganic filler in the first insulation layer is more than a contained amount of an inorganic filler in the second insulation layer.

7. The multilayer insulation film according to claim 4, wherein the multilayer insulation film is used for forming an insulation layer on a circuit board in a multilayer substrate.

8. A multilayer substrate comprising:
 a circuit board;
 an insulation layer disposed on the circuit board and having a groove; and
 metal wiring formed within the groove, wherein the insulation layer is formed using the multilayer insulation film according to claim 4.

* * * * *